US006869847B2

(12) United States Patent
Mori

(10) Patent No.: US 6,869,847 B2
(45) Date of Patent: Mar. 22, 2005

(54) SEMICONDUCTOR DEVICE MANUFACTURING METHOD THEREOF

(75) Inventor: Hideki Mori, Kanagawa (JP)

(73) Assignee: Sony Corporation, Tokyo (JP)

( * ) Notice: Subject to any disclaimer, the term of this patent is extended or adjusted under 35 U.S.C. 154(b) by 9 days.

(21) Appl. No.: 10/415,256

(22) PCT Filed: May 29, 2002

(86) PCT No.: PCT/JP02/05232

§ 371 (c)(1),
(2), (4) Date: Sep. 22, 2003

(87) PCT Pub. No.: WO03/021685

PCT Pub. Date: Mar. 13, 2003

(65) Prior Publication Data

US 2004/0046191 A1 Mar. 11, 2004

(30) Foreign Application Priority Data

Aug. 30, 2001 (JP) ........................................ 2001-262063

(51) Int. Cl.[7] ........................ H01L 21/336; H01L 29/76
(52) U.S. Cl. ...................................... 438/286; 257/339
(58) Field of Search ................................ 438/286, 306, 438/307; 257/336, 339, 344, 408

(56) References Cited

U.S. PATENT DOCUMENTS

| 4,628,341 A | | 12/1986 | Thomas | |
| 5,844,275 A | * | 12/1998 | Kitamura et al. | 257/336 |
| 5,917,217 A | * | 6/1999 | Kitamura et al. | 257/339 |
| 5,932,897 A | * | 8/1999 | Kawaguchi et al. | 438/307 |

| 2001/0012671 A1 | | 8/2001 | Hoshino | |

FOREIGN PATENT DOCUMENTS

| EP | 0179693 | 4/1986 |
| EP | 0849801 | 6/1998 |
| JP | 53-67373 | 6/1978 |
| JP | 61-88553 | 5/1986 |
| JP | 06-21441 | 1/1994 |
| JP | 10-189762 | 7/1998 |
| JP | 2001-94094 | 4/2001 |

* cited by examiner

*Primary Examiner*—Chandra Chaudhari
(74) *Attorney, Agent, or Firm*—Sonnenschein, Nath & Rosenthal LLP

(57) ABSTRACT

The present invention relates to a semiconductor device including a high withstand voltage MOS transistor and a manufacturing method thereof. The semiconductor device according to the present invention includes a MOS transistor in which a second-conductivity type source region is formed on a first-conductivity type semiconductor region, an offset drain region is interconnected to a second-conductivity type drain region and has a concentration lower than an impurity concentration of a drain region, the offset drain region is composed of a portion that does not overlap a first-conductivity type semiconductor region and a portion that overlaps part of the surface of the first-conductivity type semiconductor region and a gate electrode is formed on the surface extending from a channel region between the source region and the offset drain region to part of the offset drain region through a gate insulating film.

Thus, there can be obtained an offset drain type MOS transistor having a stable threshold voltage Vth and a low ON-state resistance.

16 Claims, 8 Drawing Sheets

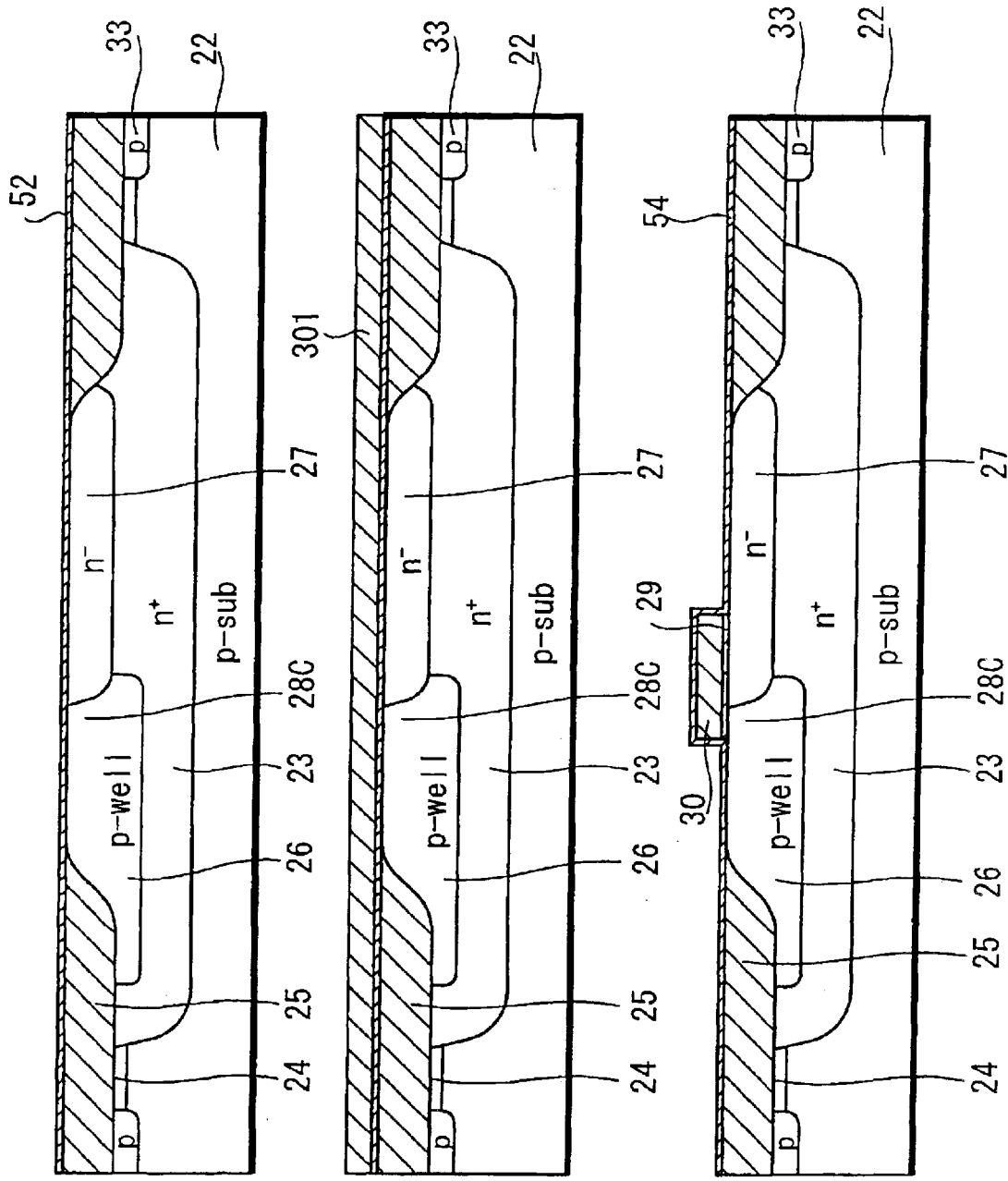

SEMICONDUCTOR DEVICE MANUFACTURING METHOD THEREOF

BACKGROUND OF THE INVENTION

The present invention relates to a semiconductor device including a high withstand voltage MOS transistor and a manufacturing method thereof, and more particularly to a semiconductor device including a high withstand voltage MOS transistor having an offset-drain structure and a manufacturing method thereof.

BACKGROUND ART

In recent years, markets of displays are rapidly expanding as personal computers and home television receivers are becoming larger in size. At present, in the field of displays, cathode-ray tubes are most popular displays because they are excellent in visibility, such as high-definition, high-intensity, a wide angle of view and high contrast. On the other hand, as displays are becoming larger in size, such larger displays need larger areas and this increase of area receives a remarkable attention. Therefore, in addition to liquid-crystal displays and projector displays, flat panel displays such as organic electroluminescence displays that can decrease their thickness much more have been so far expected as next-generation displays instead of the cathode-ray tubes. In accordance therewith, also in the fields of semiconductors, a demand for a high withstand voltage process that can form high withstand voltage driving ICs, e.g. high withstand voltage display driver ICs is increasing.

A MOS transistor having a conventional structure, for example, has a so-called symmetrical arrangement in which second-conductivity type source region and drain region are formed on a first-conductivity type semiconductor well region serving as a back-gate region and a gate electrode is formed on the surface of the semiconductor well region between the source region and the drain region through a gate insulating film, although not shown. In such MOS transistor, as the gate length decreases, a resistance component in the channel region decreases so that the MOS transistor can operate at higher speeds. In the MOS transistor having the above-mentioned structure, however, if the gate length decreases in order to increase operation speed, then when a drain voltage increases, a depletion layer from the drain region reaches the source region to cause a breakdown and hence a withstand voltage cannot be obtained.

Accordingly, as the high withstand voltage MOS transistor, there has been so far developed an offset drain type lateral operation MOS transistor in which a source-drain withstand voltage can increase, i.e. a transistor called an LD (lateral diffused) MOS transistor. FIG. 8 shows an example of an offset drain type high withstand voltage MOS transistor. This example is applied to an n-channel MOS transistor. This high withstand voltage MOS transistor 18 has a structure in which an offset drain region 20 formed of a lightly-doped n⁻ semiconductor region is fabricated into a p-type semiconductor well region 6 that serves as a back-gate electrode. Specifically, after an n-type epitaxial layer 5 had been epitaxially deposited on a first-conductivity type, e.g. p-type silicon semiconductor substrate 2 through a second-conductivity type n-type buried layer 4, an element separation region e.g. element forming region separated by a field insulating layer 3 formed by selective oxidation (so-called LOCOS) is formed. A p-type semiconductor well region 6 is formed within this element forming region to oppose the surface such that it may contact with the n-type buried layer 4. An n⁻ semiconductor region having an impurity concentration lower than that of a drain region 8D, e.g. so-called off-set drain region 20 is formed within this p-type semiconductor well region 6. Then, a heavily-doped n⁺ source region 8S is formed within the p-type semiconductor well region 6 and a heavily-doped n⁺ drain region 8D is formed distant from the gate within the offset drain region 20. A gate electrode 10 is formed on the surface of a channel region 8C formed of the p-type semiconductor well region 6 between the source region 8S and the offset drain region 20 through an insulating gate film 9. A source electrode 11S and a drain electrode 11D are interconnected to the source electrode 8S and the drain electrode 8D, respectively. Reference numeral 12 denotes an insulating film made of a suitable material such as $SiO_2$. The high withstand voltage MOS transistor is constructed in this manner. In the offset drain type high withstand voltage MOS transistor 18, an electric field can be relaxed and a withstand voltage can be increased by expanding a depletion layer generated by applying a drain voltage to the side of the offset drain region 20 formed of the lightly-doped n⁻ semiconductor region. In the high withstand voltage MOS transistor 18 shown in FIG. 8, another process for forming the offset drain region 20 should be added.

On the other hand, there has been proposed an offset drain type high withstand voltage MOS transistor having a structure that can be manufactured with the existing processes without addition of processes when the offset drain type high withstand voltage MOS transistor is applied to a CMOS transistor. FIG. 7A shows a fundamental structure of an offset drain type high withstand voltage MOS transistor that can be manufactured with the existing processes of the CMOS transistor.

This high withstand voltage MOS transistor 1 is formed within an element separation region, e.g. an element forming region separated by a field insulating layer 3 formed by selective oxidation (so-called LOCOS) after an n-type epitaxial layer 5 had been epitaxially deposited on a first-conductivity type, e.g. p-type silicon semiconductor substrate 2 through a second-conductivity type, e.g. n-type buried layer 4. Specifically, a p-type semiconductor well region 6 serving as a back-gate region and an n⁻ semiconductor region having a concentration lower than an impurity concentration of the drain region, i.e. so-called offset drain region 7 are formed within this element forming region to oppose the surface such that they may contact with the n-type buried layer 4. A p-type element forming layer beneath the field insulating layer 3, i.e. so-called channel stopper layer 19 is formed with the same process at the same time the p-type well region 6 is formed. A heavily-doped n⁺ source region 8S is formed within the p-type semiconductor well region 6 and a heavily-doped n⁺ drain region 8D is formed distant from the gate within the n⁻ semiconductor region 7 that is the offset drain region. Then, a gate electrode 10 is formed on a surface extending from a channel 8c formed of the P-type semiconductor well region to a part of the n⁻ semiconductor region 7 that is the offset drain region. A source electrode 11S and a drain electrode 11D are respectively interconnected to the source region 8S and the drain region 8D. Reference numeral 12 denotes an insulating film made of a suitable material such as $SiO_2$. The high withstand voltage MOS transistor 1 is constructed in this manner.

In this high withstand voltage MOS transistor 1, similarly as described above, when a reverse bias is applied between the source electrode 11S and the drain electrode 11D, the depletion layer expands from a pn junction between the p-type semiconductor well region 6 and the offset drain region (also referred to as a "drift region") formed of the n⁻ semiconductor region to the n⁻ semiconductor region 7. The electric field is relaxed by using the expansion of the depletion layer toward the n semiconductor region 7, whereby the withstand voltage of the MOS transistor can be maintained.

When the above-mentioned high withstand voltage MOS transistor 1 is applied to the CMOS transistor, the above-described offset drain region 7 comprising one second-conductivity type channel MOS transistor is formed at the same time a semiconductor well region serving as a back-gate region in the other first-conductivity type channel MOS transistor formed in other region, not shown, is formed. Specifically, when the high withstand voltage MOS transistor 1 is formed as one n-channel MOS transistor comprising the CMOS transistor, the offset drain region 7 formed of the lightly-doped n⁻ semiconductor region interconnected to the n⁺ drain region 8D is formed at the same time in the process in which the n-type semiconductor well region serving as the back-gate of the other p-channel MOS transistor comprising the CMOS transistor is formed. Consequently, it is possible to manufacture the CMOS transistor including the offset drain type high withstand voltage MOS transistor with the number of the existing processes.

In the above-mentioned high withstand voltage MOS transistor 1, since one process serves both as the process for forming the element separation layer (p-type channel stopper layer) 19 and the process for forming the p-type semiconductor well region 6, after the n-type epitaxial layer 5 had been epitaxially deposited and the field insulating layer 3 had been formed as shown in FIG. 7B, the element separation layer 19 and the p-type semiconductor well region 6 are formed at the same time. Specifically, after the field insulating layer 3 had been formed, a photoresist mask 14 having an opening 14a across a part of the field insulating layer 3 and an opening 14b located on the field insulating layer 3 is formed by patterning a positive type photoresist film, for example, and the p-type semiconductor well region 6 and the element separation layer (p-type channel stopper layer) 19 are formed by implanting ions of p-type impurities, e.g. ions of boron 15 through this photoresist mask 14. Having considered the case in which the element separation layer 19 is formed, ion implantation conditions are designed in such a manner that the impurity concentration may reach a peak 15 on the surface (accordingly, the depth position) of the n-type epitaxial layer 5 beneath the field insulating layer 3. In the positive type photoresist mask 14, the end portions of the opening portions 14a, 14b are formed like tapered end portions as illustrated in order to prevent interference of light required when the photoresist film is exposed thereto.

In the above-mentioned high withstand voltage MOS transistor 1, the field insulating layer 3 has a film thickness of approximately 800 nm, for example, and energy for implanting ions is approximately 360 keV. The film thickness of the photoresist mask 14 should increase as energy for implanting ions increases as described above, and the photoresist mask needs a film thickness of about 2.4 μm. One process can serve both as one process and the other process by optimizing the process conditions as described above.

However, there arises a serious problem that the threshold voltage Vth becomes larger than a designed value and is fluctuated as energy for implanting ions increases. Specifically, when energy for implanting ions is large as shown in FIG. 7B, the impurity ions 16 are caused to go through the photoresist mask 14 at the opening end portions (tapered end portions) of the photoresist mask 14 in the element forming region side so that the impurity concentration peak 15 moves near the surface of the n-type epitaxial layer 5 along the angle of the tapered opening end portion of the photoresist mask 14, thereby resulting in a heavily-doped impurity region 17 (see FIG. 7A) that exerts a serious influence upon the threshold voltage Vth.

SUMMARY OF THE INVENTION

It is an object of the present invention to provide a semiconductor device including a high withstand voltage MOS transistor in which a heavily-doped impurity region can be prevented from being formed at one portion of a channel region and in which a high withstand voltage, a stable threshold voltage Vth and a low ON-state resistance can be made compatible and a manufacturing method thereof.

A semiconductor device according to the present invention includes a MOS transistor in which a second-conductivity type source region is formed at a first-conductivity type semiconductor region and electrically interconnected to a second-conductivity type drain region, an offset drain region having an impurity concentration lower than that of the drain region is formed, the offset drain region comprises a portion that does not overlap the first-conductivity type semiconductor region and a portion that overlaps part of the surface of the first-conductivity type semiconductor region and a gate electrode is formed on the surface extending from a channel region between the source region and the offset drain region to part of the offset drain region through a gate insulating film.

The offset drain region is formed at its portion that overlaps part of the surface of the first-conductivity type semiconductor region by a region in which a first-conductivity type impurity introduced region is canceled out by a second-conductivity type impurity. Therefore, the portion in which the offset drain region does not overlap the first-conductivity type semiconductor region and the portion in which the offset drain region overlaps part of the surface of the first-conductivity type semiconductor region can be both formed in a lightly-doped second-conductivity type region.

Further, the portion in which the offset drain region does not overlap the first-conductivity type semiconductor region is formed of a second-conductivity type region and the portion in which the offset drain region overlaps part of the surface of a first-conductivity type semiconductor region is formed of a first-conductivity type region having an impurity concentration lower than that of the first-conductivity type semiconductor region.

The whole area of the channel region between the source region and the offset drain region, i.e. the channel region on the surface of the first-conductivity type semiconductor region is formed in a uniform concentration.

The above-described MOS transistor includes a first-conductivity type element separation layer (so-called channel stopper layer) that is formed beneath a separation region for separating the MOS transistor at the same time the first-conductivity type semiconductor region is formed. In this case, the separation region can be formed of a field insulating layer by selective oxidation and the first-conductivity type semiconductor region and the first-conductivity type element separation layer can be formed by implanting ions such that the semiconductor surface beneath the field insulating layer reaches an impurity concentration peak.

When the semiconductor device according to the present invention is applied to a semiconductor device including a CMOS transistor, the offset drain type MOS transistor having the above-described arrangement is formed as one second-conductivity type channel MOS transistor comprising a CMOS transistor, a first-conductivity type semiconductor region of the second-conductivity type channel MOS transistor is formed as a back-gate region and the offset drain region is formed at the same time the back-gate region of the other first-conductivity type channel MOS transistor comprising the CMOS transistor is formed.

A semiconductor device manufacturing method according to the present invention is comprised of the steps of a process for forming a separation region for separating an element forming region on a semiconductor base, a process for forming a first-conductivity type semiconductor region on the element forming region, a process for forming an offset drain region comprising a portion that does not overlap the first-conductivity type semiconductor region and a portion that overlaps part of the surface of the first-conductivity type semiconductor region and which has an impurity concentration lower than that of a drain region, a process for forming second-conductivity type source region and drain region on the first-conductivity type semiconductor region and the offset drain region, respectively, and a process for forming a gate electrode on a surface extending from a channel region comprised of the first-conductivity type semiconductor region between the source region and the offset drain region to the offset drain region through a gate insulating film.

A semiconductor device manufacturing method according to the present invention is comprised of the steps of a process for forming a field insulating layer formed by selective oxidation for separating an element forming region after a second-conductivity type buried region had been formed on a first-conductivity type semiconductor substrate and a second-conductivity type epitaxial layer had been formed, a process for forming a first-conductivity type semiconductor region on the element forming region, a process for forming an offset drain region having an impurity concentration lower than that of a drain region by introducing second-conductivity impurities over a portion that does not overlap the first-conductivity type semiconductor region and a portion that overlaps part of the surface of the first-conductivity type semiconductor region, a process for forming second-conductivity type source region and drain region on the first-conductivity type semiconductor region and the offset drain region, respectively, and a process for forming a gate electrode on a surface extending from a channel region composed of the first-conductivity type semiconductor region between the source region and the offset drain region to the offset drain region through a gate insulating film.

The portion in which the offset drain region does not overlap the first-conductivity type semiconductor region and the portion in which the offset drain region overlaps part of the surface of the first-conductivity type semiconductor region are both formed so as to serve as lightly-doped second-conductivity type regions. Further, the portion in which the offset drain region does not overlap the first-conductivity type semiconductor region may be formed so as to serve as a second-conductivity type region and the portion in which the offset drain region overlaps part of the surface of the first-conductivity type semiconductor region is formed so as to serve as a first-conductivity type region having an impurity concentration lower than that of the first-conductivity type semiconductor region.

According to the present invention, the first-conductivity type semiconductor region and the offset drain region can be formed by ions of second-conductivity type impurities and by heat treatment for activation after ions of first-conductivity type impurities had been implanted. At that time, the ions of the second-conductivity type impurities are implanted with a dose large enough to cancel an impurity concentration peak portion on the surface side after the ions of the first-conductivity type impurities had been implanted.

When the first-conductivity type semiconductor region, the offset drain region, the source region and the drain region are formed, the first-conductivity type semiconductor region and the offset drain region can be formed by implanting ions of first-conductivity type impurities with a dose of $1 \times 10^{13}$ to $1 \times 10^{14}$ cm$^{-2}$ and by implanting ions of second-conductivity type impurities with a dose of $5 \times 10^{12}$ to $1 \times 10^{14}$ cm$^{-2}$ and the second-conductivity type source region and drain region can be formed by implanting ions of second-conductivity type impurities with a dose of $1 \times 10^{15}$ to $1 \times 10^{16}$ cm$^{-2}$.

The first-conductivity type semiconductor region and a first-conductivity type element separation layer beneath the separation region are formed at the same time. At that time, the first-conductivity type semiconductor region and a first-conductivity type element separation layer beneath the separation region are formed at the same time by introducing first-conductivity type impurities such that the semiconductor surface beneath the separation region reaches an impurity concentration peak obtained when ions are implanted. When ions are implanted, the first-conductivity type semiconductor region, a first-conductivity type element separation layer beneath the separation region and the offset drain region are formed at the same time by implanting ions of first-conductivity type impurities through a positive type photoresist mask whose opening end portion is tapered and by implanting ions of second-conductivity type impurities through a positive type photoresist mask whose opening end portion is tapered.

The whole area of the channel region between the source region and the offset drain region, i.e. the channel region on the surface of the first-conductivity type semiconductor region is formed with a uniform concentration.

When the semiconductor device manufacturing method according to the present invention is applied to a manufacturing process of a semiconductor device including a CMOS transistor, the first-conductivity type semiconductor region is formed as a back-gate region of one second-conductivity type channel MOS transistor comprising the CMOS transistor and the offset drain region is formed at the same time a back-gate region of the other first-conductivity type channel MOS transistor comprising the CMOS transistor is formed.

According to the semiconductor device of the present invention, since the lightly-doped offset drain region comprising the portion that does not overlap the first-conductivity type semiconductor region and the portion that overlaps part of the surface of the first-conductivity type semiconductor region is formed in the MOS transistor having the offset drain structure, the heavily-doped impurity region formed at the above one portion on the surface of the first-conductivity type semiconductor region is canceled out and removed by the offset drain region. As a result, the whole area of substantially the channel region formed by the first conductivity-type semiconductor region between the source region and the offset drain region is formed with a uniform low concentration. Thus, the threshold voltage Vth can be prevented from becoming larger than a design value and can also be prevented from being fluctuated so that the stable threshold voltage Vth and the stable low ON-state resistance can be obtained. Therefore, it becomes possible to realize the MOS transistor having the offset drain structure in which the high withstand voltage, the stable threshold voltage Vth and the stable low ON-state resistance can be made compatible.

The portion that overlaps part of the surface of the first-conductivity type semiconductor region of the offset drain region is formed of the region in which the first-conductivity type impurity introduced region is canceled by the second-conductivity type impurities. Thus, when the offset drain region is formed such that the portion that overlaps part of the surface of the first-conductivity type semiconductor region and the portion that does not overlap he first-conductivity type semiconductor region are formed as the lightly-doped second-conductivity type semiconductor regions, the whole area of the channel region is doped uniformly so that the stable threshold voltage Vth can be obtained as it is designed. Moreover, even when the portion in which the offset drain region overlaps the first-conductivity type semiconductor region is formed as the first-conductivity type region, since it is formed by the region having the concentration lower than the impurity concentration of the first-conductivity type semiconductor region, the substantially threshold voltage Vth is determined by the heavily-doped first conductivity-type semiconductor region between the source region and the offset drain region, i.e. the channel region and hence the stable threshold voltage Vth can be obtained as it is designed.

Since the first-conductivity type semiconductor region and the first-conductivity type element separating layer (so-called channel stopper layer) beneath the separation region are formed at the same time, the manufacturing process can be simplified. Then, when the separation region is formed of the field insulating layer by selective oxidation and the first-conductivity type semiconductor region and the first-conductivity type element separation layer are formed at the same time by ion implantations such that the semiconductor surface beneath the field insulating layer may reach the peak of the impurity concentration, since this transistor includes the above-described offset drain region, unnecessary heavily-dope region is not formed on the surface side and hence the stable threshold voltage Vth can be obtained.

When the MOS transistor of the present invention is applied to the CMOS transistor, the MOS transistor with the offset drain structure having the above-described arrangement is formed as one second-conductivity type channel MOS transistor comprising the CMOS transistor, the first-conductivity type semiconductor region of this second-conductivity type channel MOS transistor is formed as the back-gate region and the offset drain region is formed at the same time the back-gate region of the other first-conductivity type channel MOS transistor comprising the CMOS transistor is formed, whereby the high withstand voltage CMOS transistor can be obtained through the existing number of processes without addition of processes.

According to the semiconductor device manufacturing method of the present invention, since the manufacturing process of the MOS transistor having the offset drain structure includes a series of the above-mentioned processes, in particular, the process for forming the offset drain region comprising the portion that does not overlap the first-conductivity type semiconductor region and the portion that overlaps part of the surface of the first-conductivity type semiconductor region and which has the impurity concentration lower than that of the drain region, the heavily-doped region formed on the above one portion of the surface of the channel region side of the first-conductivity type semiconductor region is canceled out and removed by the offset drain region, and hence the concentration of substantially the channel region formed by the first-conductivity type semiconductor region between the source region and the offset drain region can be made uniform on the whole area. Accordingly, the threshold voltage Vth can be prevented from becoming larger than the design value or can be prevented from being fluctuated. Also, the highly-efficient and high withstand voltage MOS transistor having the offset drain structure in which the stable threshold voltage Vth and the low ON-state resistance are made compatible can be easily manufactured with high reliability.

Since the offset drain region is formed such that the portion that does not overlap the first-conductivity type semiconductor region and the portion that overlaps part of the surface of the first-conductivity type semiconductor region are both formed as the lightly-doped second-conductivity type semiconductor regions, the MOS transistor with the offset drain structure having the above-described stable threshold voltage Vth and low ON-state resistance can be manufactured. Further, when the offset drain region is formed such that the portion that does not overlap the first-conductivity type semiconductor region is formed as the second-conductivity type semiconductor region and the portion that overlaps part of the surface of the first-conductivity type semiconductor region is formed as the first-conductivity type semiconductor region having the concentration lower than the impurity concentration of the first-conductivity type semiconductor region, the portion that overlaps the first-conductivity type semiconductor region acts as the offset drain region, and hence the MOS transistor with the offset drain structure having the above-described threshold voltage Vth and low ON-state resistance can be manufactured.

When the first-conductivity type semiconductor region and the offset drain region are formed simultaneously by implanting ions of second-conductivity type impurities and by heat treatment for activation after ions of first-conductivity type impurities had been implanted, the manufacturing process can be simplified. At that time, when ions of second-conductivity type impurities are implanted with a dose large enough to cancel the impurity concentration peak generated at portion on the surface side out after ions of first-conductivity type impurities had been implanted, the first-conductivity type heavily-doped region is not formed at the portion corresponding to the first-conductivity type impurity concentration peak generated at portion on the above-described surface side and substantially the channel region in which the concentration can be made uniform in the whole area can be formed.

When the first-conductivity type semiconductor region and the offset drain region are formed, the above-mentioned offset drain region and the first-conductivity type semiconductor region including the channel region in which the concentration is made uniform in the whole area can be formed by implanting ions of first-conductivity type impurities of a dose of $1 \times 10^{13}$ to $1 \times 10^{14}$ cm$^{-2}$ and by implanting ions of second-conductivity type impurities of a dose of $5 \times 10^{12}$ to $1 \times 10^{14}$ cm$^{-2}$. Further, since the second-conductivity type source region and drain region are formed by implanting ions of second-conductivity type impurities of a dose of $1 \times 10^{15}$ to $1 \times 10^{16}$ cm$^{-2}$, not only the above-described first-conductivity type semiconductor region and the offset drain region can be formed but also the MOS transistor with the above-mentioned offset drain structure can be manufactured.

Since the first-conductivity type semiconductor region and the first-conductivity type element separation layer beneath the separation layer are formed at the same time, the number of manufacturing processes can decrease and the manufacturing process can be simplified. When the first-conductivity type semiconductor region and the first-conductivity type element separation layer are simultaneously formed by introducing first-conductivity type impurities such that the semiconductor surface beneath the separation region may reach the impurity concentration peak obtained when ions are implanted, since the offset drain region is formed as described above, unnecessary heavily-doped region can be prevented from being formed on the surface of the channel region side. When the positive type photoresist mask is used as the mask for implanting ions, although the opening portion end is tapered and the concentration peak of the first-conductivity type impurity reaches the surface side at this tapered portion, since the offset drain region is formed as described above, unnecessary heavily-doped impurity region can be prevented from being formed on the surface of the channel region side.

When the MOS transistor manufacturing method according to the present invention is applied to the manufacturing process of the CMOS transistor, since the first-conductivity type semiconductor region is formed as the back-gate region of one second-conductivity type channel MOS transistor comprising the CMOS transistor and the above-described offset drain region is formed at the same time the back-gate region of the other first-conductivity type channel MOS transistor comprising the CMOS transistor is formed, it becomes possible to manufacture the semiconductor device having the CMOS transistor in which at least one MOS transistor has the offset drain structure in which this transistor is the high withstand voltage transistor and which has the stable threshold voltage Vth and the low ON-state resistance.

BRIEF DESCRIPTION OF DRAWINGS

FIGS. 5A to 5C are manufacturing process diagrams (No. 4) showing a manufacturing method of a semiconductor device, particularly, its high withstand voltage MOS transistor according to an embodiment of the present invention.

DETAILED DESCRIPTION OF THE PRESENTLY PREFERRED EMBODIMENTS

Embodiments according to the present invention will be described below with reference to the drawings.

Figure 1:
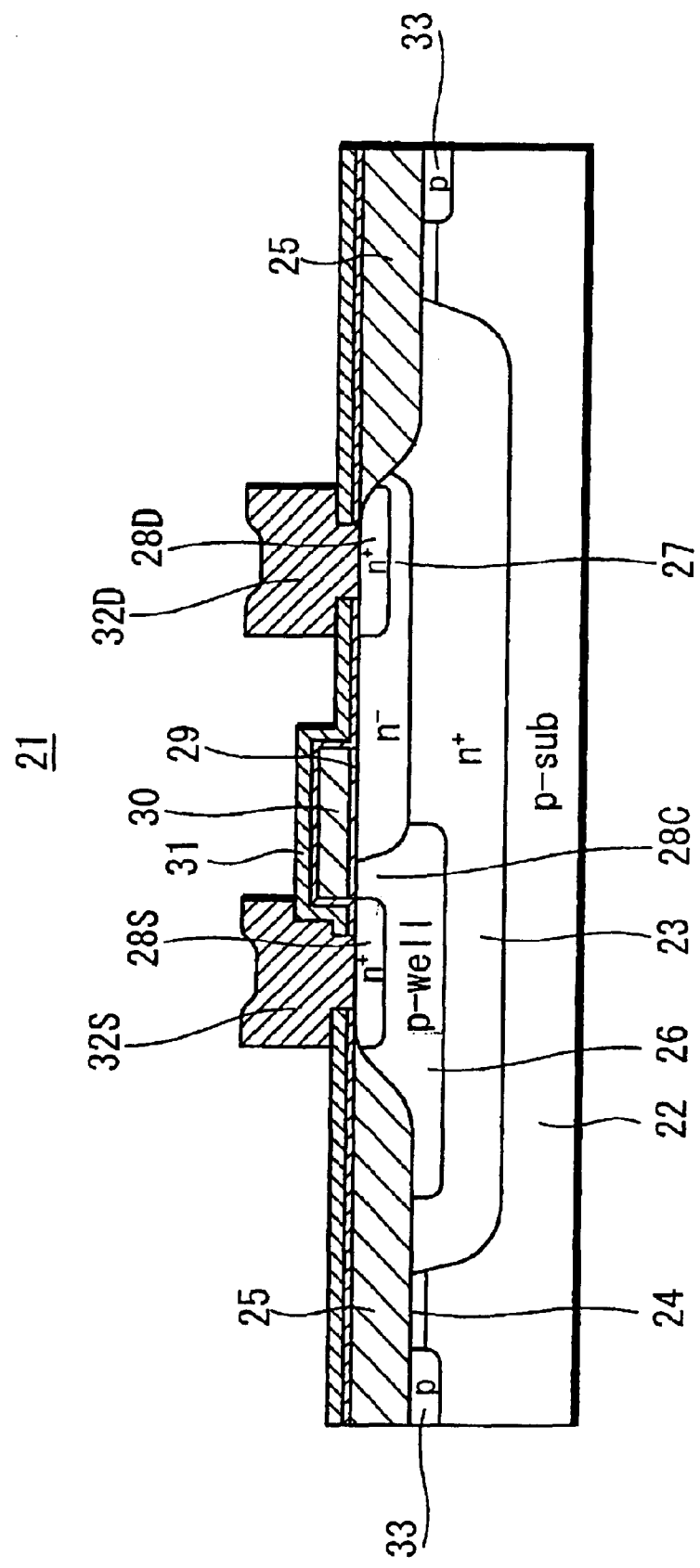
FIG. 1 is a diagram showing an arrangement of a semiconductor device, particularly, its high withstand voltage MOS transistor according to an embodiment of the present invention.

FIG. 1 shows a semiconductor device, in particular, a highly-efficient and high withstand voltage MOS transistor according to an embodiment of the present invention.

A high withstand voltage MOS transistor 21 according to this embodiment is a MOS transistor having an offset drain structure. This high withstand voltage MOS transistor 21 is formed on an element separation region, in this embodiment, an element forming region separated by a field insulating layer 25 formed by selective oxidation (LOCOS) after an n-type epitaxial layer 24 had been deposited on a first-conductivity type, e.g. p-type silicon semiconductor substrate 22 through an n-type buried layer 23. Specifically, a p-type semiconductor well region 26 is formed to oppose the n-type buried layer 23 and an offset drain region 27 having an impurity concentration lower than that of a drain region is formed. This offset drain region 27 comprises a portion that doe not overlap the p-type semiconductor well region 26 and a portion that overlaps part of the surface of the p-type semiconductor well region 26. The offset drain region 27 is formed by introducing n-type impurities and the portion that overlaps part of the surface of the p-type semiconductor well region is formed by a region in which the p-type impurity introduced region is canceled by n-type impurities. Accordingly, in the offset drain region 27, both of the portion that does not overlap the p-type semiconductor well region 26 and the portion that overlaps part of the surface of the p-type semiconductor well region 26 can be formed by semiconductor regions of low concentration, i.e. so-called $n^-$ semiconductor regions. Moreover, the offset drain region 27 can be formed in such a manner that the portion that does not overlap the p-type semiconductor well region 23 becomes a $n^-$ semiconductor region and that the portion that overlaps part of the surface of the p-type semiconductor well region 23 becomes a p-type semiconductor region (e.g. $p^{--}$ region) having an impurity concentration lower than that of the p-type semiconductor well region 26. This offset drain region 27 is also called a drift region. A p-type element separation layer (so-called p-type channel stopper layer) 33 is formed beneath the field insulating layer 25. This p-type element separation layer 33 is formed at the same time the p-type semiconductor well region 26 is formed.

A heavily-doped $n^+$ source region 22S is formed on the surface of the p-type semiconductor well region 26. A heavily-doped $n^+$ drain region 28D is formed on the surface of the offset drain region 27 formed of an $n^-$ semiconductor region. Then, a gate electrode 30 is formed on the surface extending from a channel region 28C on the surface of the p-type semiconductor well region 26 to part of the offset drain region 27 through a gate insulating film 29 so as to adjoin the end of the $n^+$ source region 28S. The $n^+$ drain region 28D is formed at the position distant from the gate insulating film 29 and the other end of the gate electrode 30. An insulating film 32 formed of an $SiO_2$ film, for example, is formed on the whole surface including the gate electrode 30, and a source electrode 32S and a drain electrode 32D are interconnected to the $n^+$ source region 28S and the $n^+$ drain region 28D through contact holes formed on the insulating film 31, respectively. The field insulating layer 25 and the p-type channel stopper layer 33 formed beneath the field insulating layer constitute a substantially element separation region. In this manner, there is fabricated the high withstand voltage MOS transistor 21 according to this embodiment.

When this high withstand voltage MOS transistor 21 is applied to a CMOS transistor, the offset drain region 27 comprising one second-conductivity type channel MOS transistor is formed at the same time a second-conductivity type semiconductor well region that serves as a back-gate region in a first-conductivity type channel MOS transistor formed on other region, though not shown, is formed. Specifically, when the high withstand voltage MOS transistor 21 is one n-channel MOS transistor comprising the CMOS transistor, the offset drain region 27 formed of a lightly-doped n⁻ semiconductor region electrically interconnected to the n⁺ drain region 28D is formed at the same time an n-type semiconductor well region serving as a back-gate region of other p-channel MOS transistor comprising the CMOS transistor is formed.

FIGS. 2 to 6 show a manufacturing method of the above-mentioned high withstand voltage MOS transistor 21 according to the embodiment.

Figure 2A:
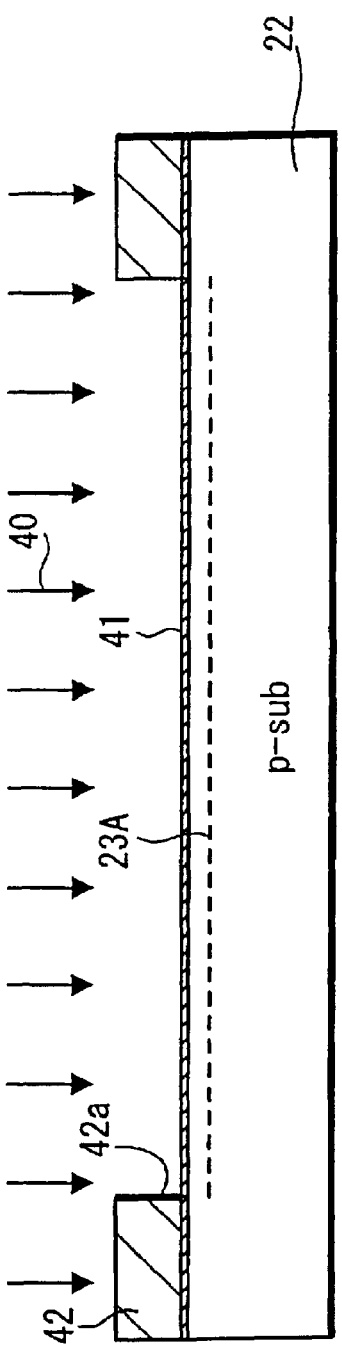
FIGS. 2A to 2C are manufacturing process diagrams (No. 1) showing a manufacturing method of a semiconductor device, particularly, its high withstand voltage MOS transistor according to an embodiment of the present invention.

First, as shown in FIG. 2A, a first-conductivity type, e.g. p-type silicon semiconductor substrate 22 is prepared, and an insulating film 41 having a predetermined thickness is formed on one major surface of this semiconductor substrate 22 by thermal oxidation. In this embodiment, the SiO$_2$ film 41 having a thickness ranging from approximately 30 nm to 50 nm is formed by steam oxidation at a temperature ranging from approximately 900° C. to 1000° C. Next, a photoresist mask 42 having an opening 42a formed at its portion corresponding to the element forming region is formed by using photolithography technique and ion-implantation technique. An n-type ion implanted region 23A is formed on the p-type semiconductor substrate 22 by implanting ions of second-conductivity type impurities, i.e. n-type impurities 40 through this photoresist mask 42.

Figure 2B:
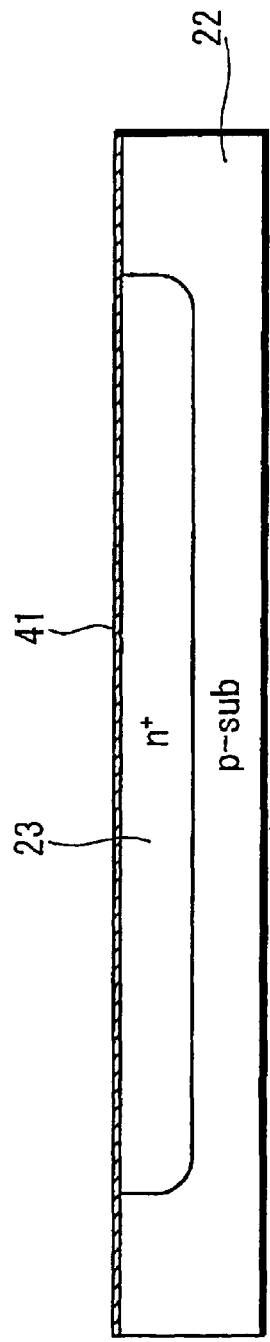

In this embodiment, ions of phosphorous (P) 40 having a dose ranging approximately $1 \times 10^{13}$ to $5 \times 10^{13}$ cm² are implanted. Then, as shown in FIG. 2B, after the photoresist mask 42 had been removed, the n-type buried layer 23 is formed by heat treatment at a temperature ranging from approximately 950° C. to 1000° C.

Figure 2C:
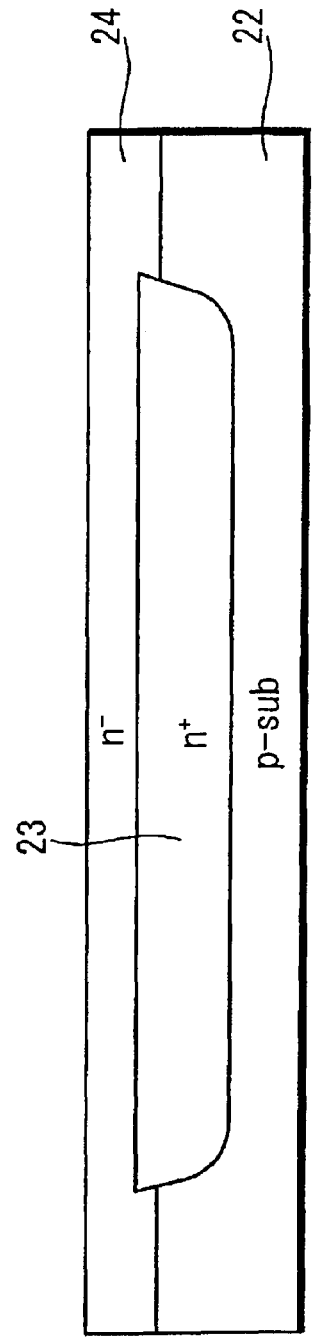

Next, as shown in FIG. 2C, the insulating film 41 formed by thermal oxidation is removed and an n-type epitaxial layer 24 having a predetermined resistivity, in this embodiment, 5 to 10 Ωcm is epitaxially deposited on the semiconductor substrate. The semiconductor substrate 22, the n-type buried layer 23 and the n-type epitaxial layer 24 constitute the semiconductor base.

Figure 3A:
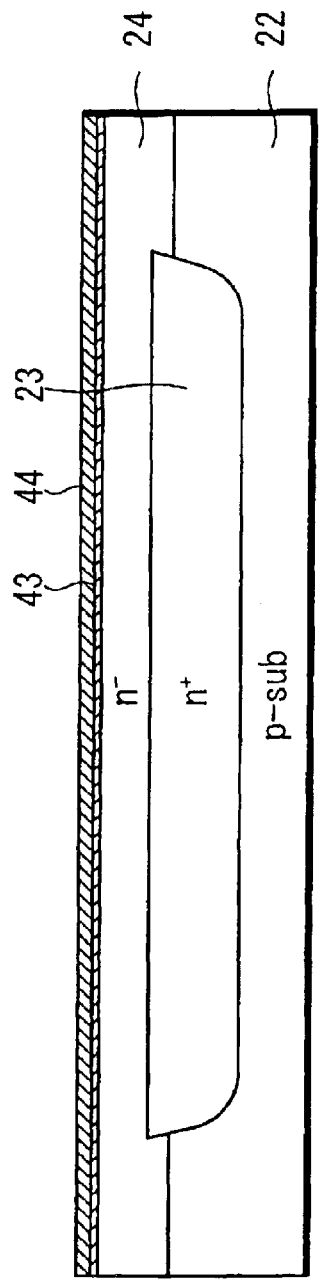
FIGS. 3A to 3C are manufacturing process diagrams (No. 2) showing a manufacturing method of a semiconductor device, particularly, its high withstand voltage MOS transistor according to an embodiment of the present invention.

Next, as shown in FIG. 3A, a silicon oxide film 43 is formed on the surface of the n-type epitaxial layer 24 by thermal oxidation. In this embodiment, the SiO$_2$ film 43 having a film thickness ranging from 60 nm to 100 nm is formed by steam oxidation at a temperature ranging from approximately 900° C. to 950° C.

Subsequently, a silicon nitride film 44 is formed on the SiO$_2$ film 43 by reduced CVD (chemical vapor growth). In this embodiment, there is formed the Si$_3$N$_4$ film 44 having a film thickness ranging from approximately 80 nm to 100 nm.

Figure 3B:
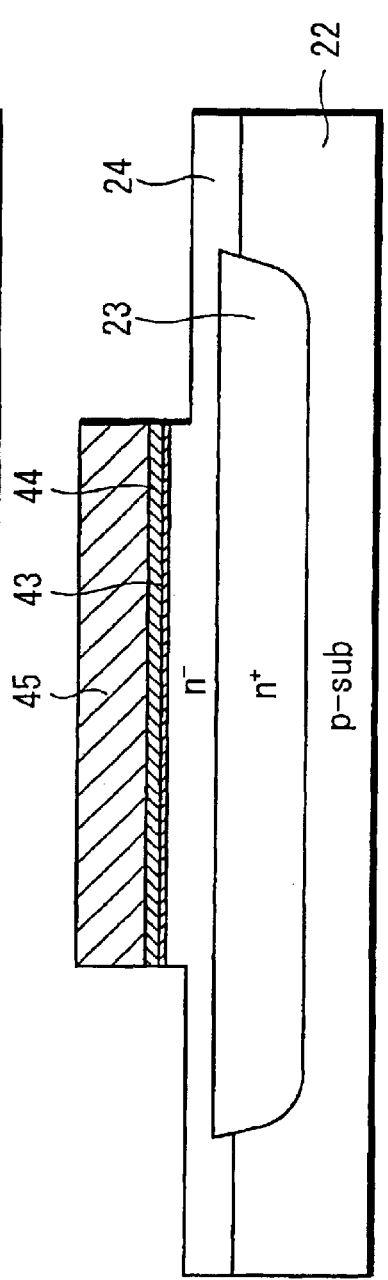

Next, as shown in FIG. 3B, a photoresist mask 45 is formed on the region corresponding to an element forming region (so-called active region) in which the target high withstand voltage MOS transistor should be formed by photolithography technique. Then, part of the surfaces of the Si$_3$N$_4$ film 44, the SiO$_2$ film 43 and the n-type epitaxial layer 24 is selectively etched away by anisotropy etching technique such as RIE (reactive ion etching).

Figure 3C:
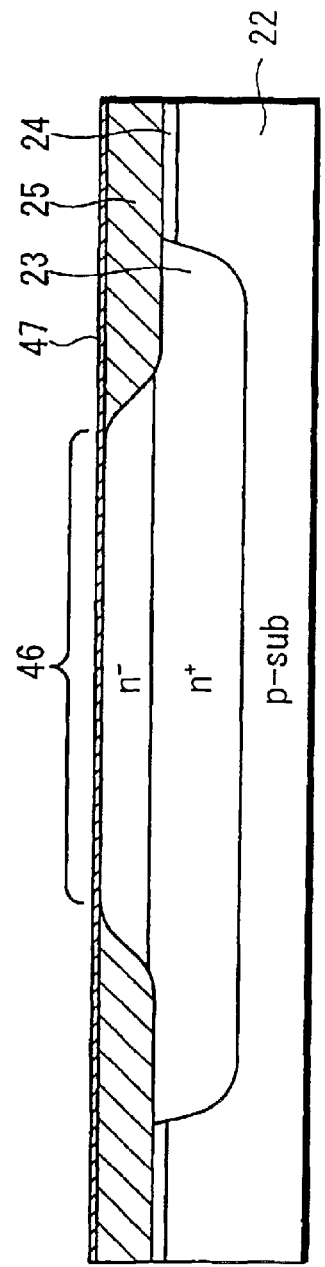

Next, after the photoresist mask 45 had been removed, as shown in FIG. 3C, the field insulating layer 25 is formed by selective oxidation (LOCOS) treatment. In this embodiment, there is formed the silicon oxide layer 25 having an oxidation film thickness ranging from approximately 600 nm to 900 nm by steam oxidation at a temperature ranging from approximately 950° C. to 1000° C. At that time, since the surface of the epitaxial layer 24 in the region that is selectively oxidized in advance is selectively removed, the field insulating layer 25 becomes flush with the epitaxial layer 24. A region encircled by the field insulating layer 25 serves as the element forming region 46. Subsequently, the Si$_3$N$_4$ film 44 is removed by hot phosphoric acid. Further, after the SiO$_2$ film had been removed from the surface of the n-type epitaxial layer 24 by chemicals dissolved water containing hydrogen fluoride (HF), a heat oxide film, in this embodiment, an SiO$_2$ film 47 having a film thickness ranging from approximately 20 nm to 50 nm is formed again by steam oxidation at a temperature ranging from 950° C. to 1000° C.

Figure 4A:
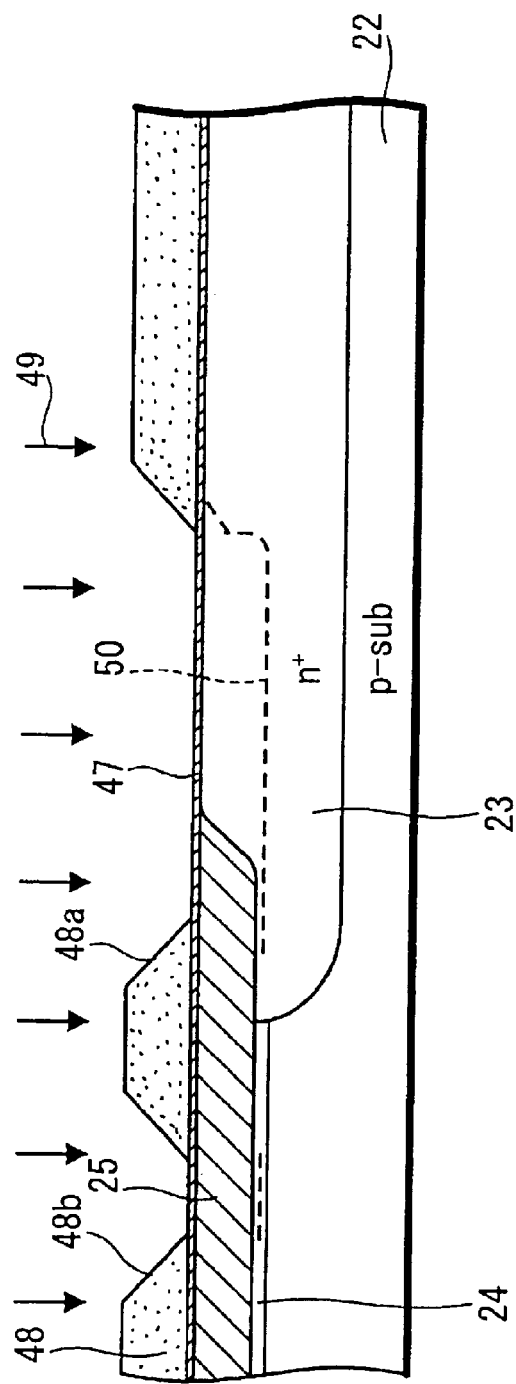
FIGS. 4A and 4B are manufacturing process diagrams (No. 3) showing a manufacturing method of a semiconductor device, particularly, its high withstand voltage MOS transistor according to an embodiment of the present invention.

Next, as shown in FIG. 4A, ions of p-type impurities 49 are implanted to the semiconductor region beneath part of the field insulating layer 25 that will be formed later on and a region corresponding to the p-type semiconductor well region that serves as an active region by photolithography technique and ion implantation technique.

Specifically, after the field insulating layer 25 had been formed, a photoresist mask 48 having an opening 48a extending from a half of the element forming region 46 to part of the field insulating layer 25 of one side and an opening 48b located on the field insulating layer 25 is formed by patterning a positive type photoresist film, for example. Since the photoresist mask 48 is the positive type photoresist mask, the opening end portions of the openings 48a, 48b are tapered as illustrated.

Subsequently, ions of p-type impurities are implanted through this photoresist mask 48. In this embodiment, ions of boron (B) 49 having a dose ranging from approximately $1 \times 10^{13}$ to $1 \times 10^{14}$ cm⁻² are implanted. Ions of boron 49 are implanted such that the boron concentration reaches a peak 50 on the surface of the n-type epitaxial layer beneath the field insulating layer 25, in the active region, the surface of the n⁺ buried layer 23 (accordingly, its depth position). Accordingly, in the active region beneath the opening end portion (tapered end portion) of the photoresist mask 48, ions of boron are caused to go through the photoresist mask 48 so that the boron concentration peak 50 is moved near the surface of the n-type epitaxial layer 24 along the tapered angle of the photoresist mask 48.

Figure 4B:
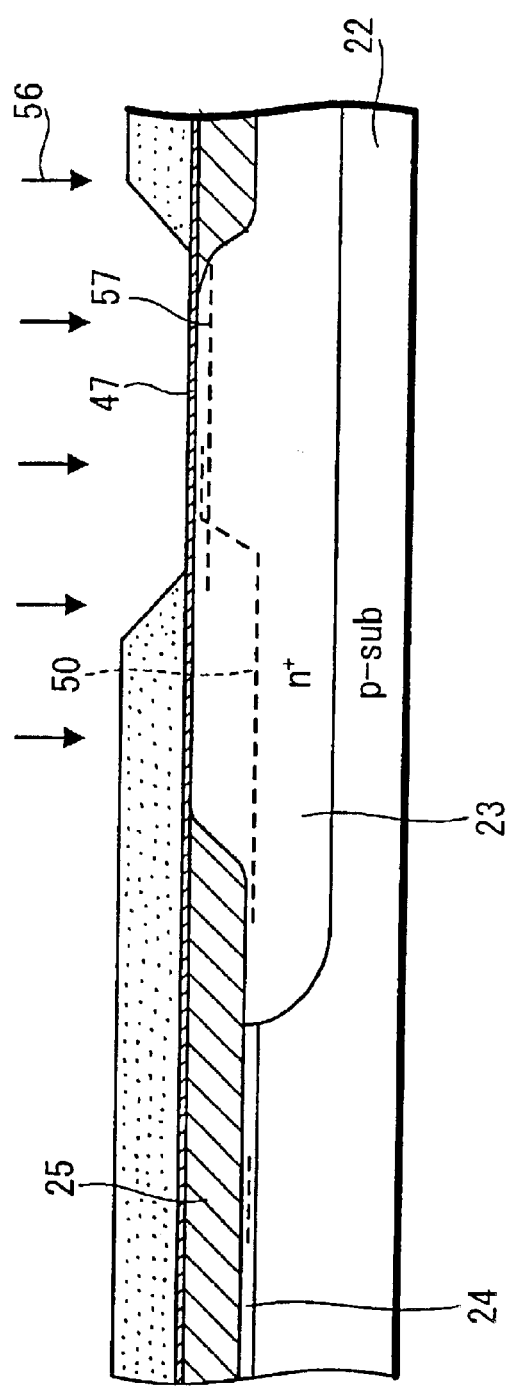

Next, the photoresist mask 48 is removed, and as shown in FIG. 4B, ions of n-type impurities 56 are implanted on the region corresponding to the lightly-doped offset drain region that will be formed later on by using photolithography technique and ion implantation technique one more time.

Specifically, a positive type photoresist mask 51, for example, is formed and ions of n-type impurities are implanted through this photoresist mask 51. Ions of n-type impurities are implanted up to the p-type impurity ion implanted region so as to cancel the concentration peak 50 portion from the surface side of the n-type impurity ion implantation region in which ions had been implanted previously. In this embodiment, ions of phosphoric (P) having a dose ranging from approximately $5 \times 10^{12}$ to $1 \times 10^{14}$ cm$^{-2}$ are implanted. Reference numeral 57 denotes a phosphoric concentration peak portion.

Next, as shown in FIG. 5A, after the photoresist mask 51 had been removed, by heat treatment, in this embodiment, heat treatment at a temperature ranging from approximately 1100° C. to 1200° C., the p-type channel stopper region 33 serving as the element separation layer is formed beneath portion of the field insulating layer 25 and the p-type semiconductor well region 26 and an n$^-$ semiconductor region 27 that serves as the offset drain region are formed on the active region at the same time. The n$^-$ semiconductor region 27 is formed such that it reaches the n-type buried layer 23 and that part thereof overlaps part of the surface of the p-type semiconductor well region 26 from the active region that does not overlap the p-type semiconductor well region 26. Although the portion in which the n$^-$ semiconductor region 27 overlap part of the surface of the p-type semiconductor well region 27 inherently exists on the channel region 28C on the surface of the p-type semiconductor well region 26 and has a high concentration of p-type impurities, this heavily-doped portion is canceled by the n$^-$ semiconductor region 27. Specifically, the portion in which the n$^-$ semiconductor region 27 overlaps the p-type semiconductor well region 26 serves as either an n$^-$ region or a p$^{--}$ region depending upon a dose of n-type impurities. Since even the p$^{--}$ region has a concentration lower than the impurity concentration of the p-type semiconductor well region 26, the n$^-$ region and the p-region substantially serve as the offset drain region.

The p-type semiconductor well region 26 is formed such that it may reach the n-type buried layer 23 and that the whole area of the channel region 28C on the surface may have a uniform low concentration. A SiO$_2$ film 52 is formed on the surface of this semiconductor well region by thermal oxidation.

Next, the SiO$_2$ film 52 is removed from the surface by chemicals dissolved water containing hydrogen fluoride (HF), and as shown in FIG. 5B, the gate insulating film 29 and a gate electrode material film 301 are sequentially formed on the whole surface including the p-type semiconductor well region 26 and the offset drain region 27 formed of the n$^-$ semiconductor region.

In this embodiment, the gate insulating film (SiO$_2$ film) 29 having a film thickness ranging from approximately 20 nm to 50 nm is formed by steam oxidation at a temperature ranging from approximately 950° C. to 1000° C. Subsequently, there is formed the gate electrode material film 301 made of an n-type impurity-doped n$^+$ polycrystalline silicon film having a film thickness of approximately 400 nm by CVD.

Next, as shown in FIG. 5C, the gate insulating film 29 and the gate electrode material film 301 are selectively removed by using photolithography technique and anisotropy etching technique such as RIE, whereby the gate insulating film 20 and the gate electrode 30 are formed on only the gate forming region. The gate insulating film 29 and the gate electrode 30 are formed in a range extending from the channel region 28C formed of the surface of the p-type semiconductor well region 26 to part of the n$^-$ semiconductor region 27.

Subsequently, after a photoresist mask (not shown) had been removed, a heat oxidation film 54 is formed on the whole surface. In this embodiment, a silicon oxide film (SiO$_2$) film 54 having a film thickness ranging from approximately 10 nm to 20 nm is formed on the whole surface by steam oxidation at a temperature ranging from approximately 800° C. to 900° C.

Next, by using photolithography technique and ion implantation technique, ions of p-type impurities are implanted on a potential lead-out region (so-called back-gate lead-out region) of the p-type semiconductor well region 26 that serves as the back-gate region (not shown). In this embodiment, ions of boron (B) having a dose of approximately from $1 \times 10^{15}$ cm$^{-2}$ are implanted.

Further, after the above-described photoresist mask had been removed, similarly by using photolithography technique and ion-implantation technique, ions of n-type impurities are implanted on the source forming region of the p-type semiconductor well region 26 and the drain forming region of the n semiconductor region 27 (not shown). In this embodiment, ions of arsenic (As) having a dose of approximately from $1 \times 10^{15}$ to $1 \times 10^{16}$ cm$^{-2}$ are implanted.

Figure 6A:
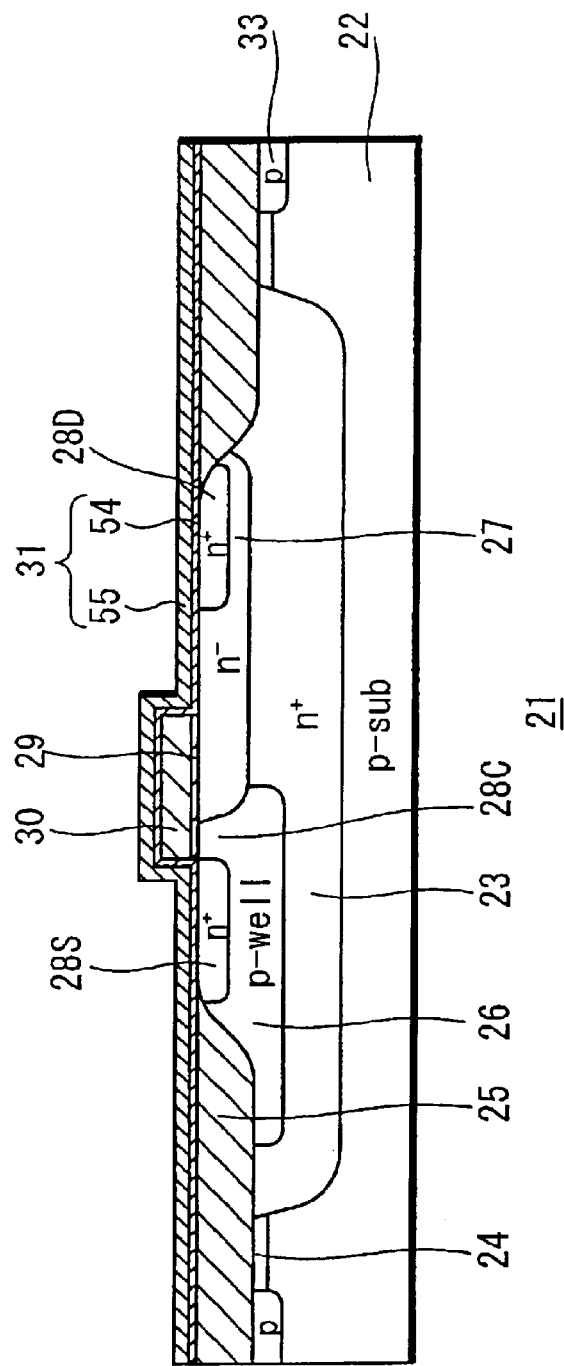
FIGS. 6A and 6B are manufacturing process diagrams (No. 5) showing a manufacturing method of a semiconductor device, particularly, its high withstand voltage MOS transistor according to an embodiment of the present invention.

Next, after the above-described photoresist mask (not shown) had been removed, as shown in FIG. 6A, an insulating film, in this embodiment, an SiO$_2$ film having a film thickness of approximately 600 nm was formed by CVD. Further, an n$^+$ source region 28S is formed within the p-type semiconductor well region 26a and an n$^+$ drain region 28D is formed within the n$^-$ semiconductor region 27 by heat treatment at a temperature ranging from approximately 850° C. to 950° C. At the same time, a p$^+$ well region lead-out region (not shown) is formed within the p-type semiconductor well region 26. The SiO$_2$ film 54 and the SiO$_2$ film 55 constitute the insulating film 31.

Figure 6B:
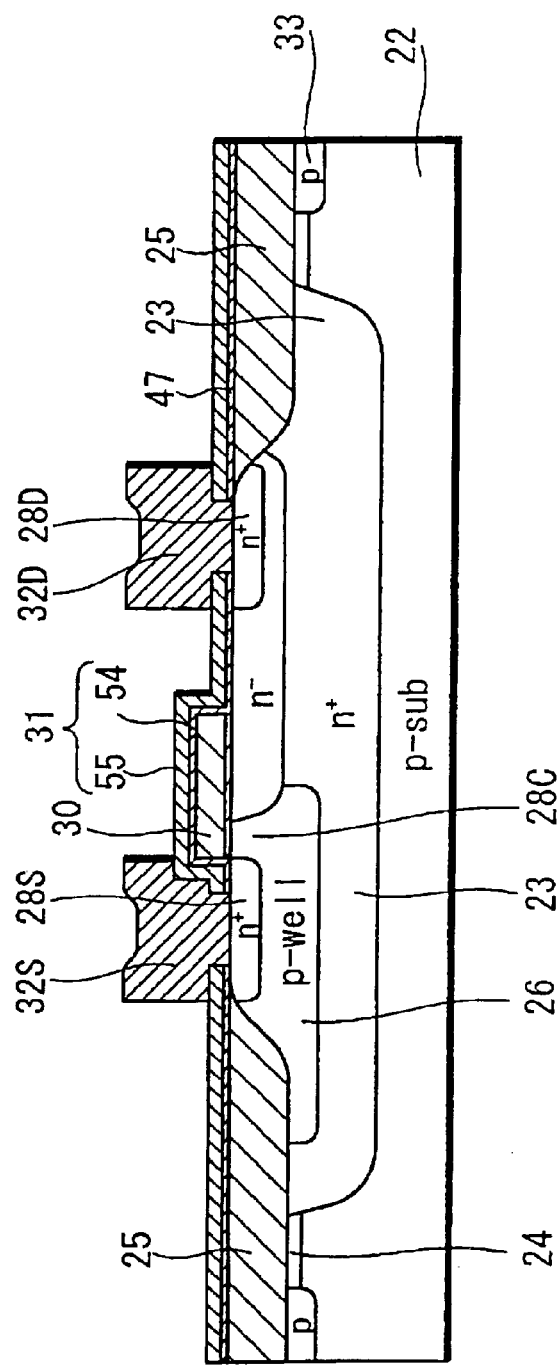
Figures 7A, 7B:
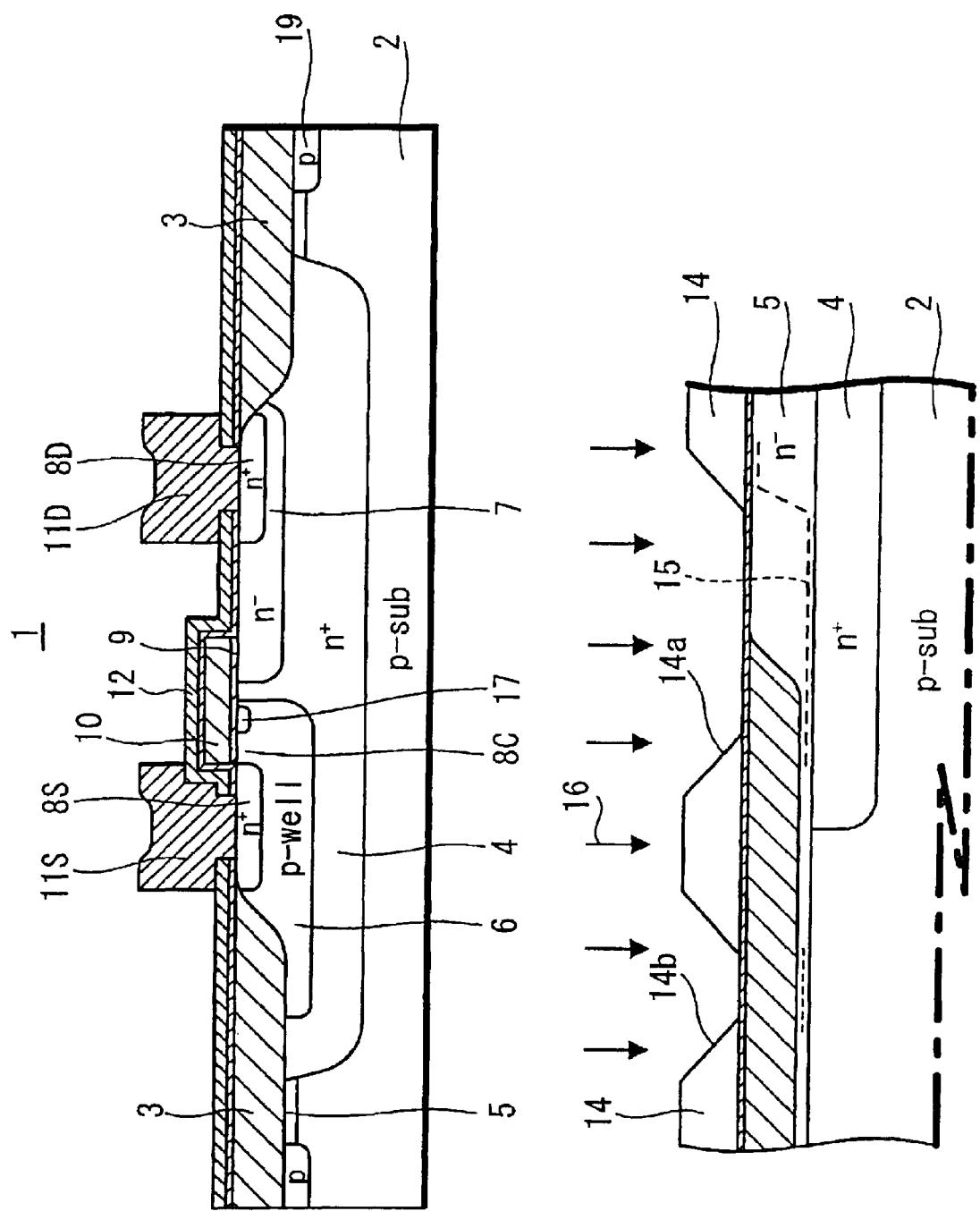
FIG. 7A is a diagram showing an arrangement of an example of a semiconductor device, in particular, its high withstand voltage MOS transistor according to the prior art.
FIG. 7B is a process diagram showing a process somewhere in the manufacturing process of FIG. 7A.
Figure 8:
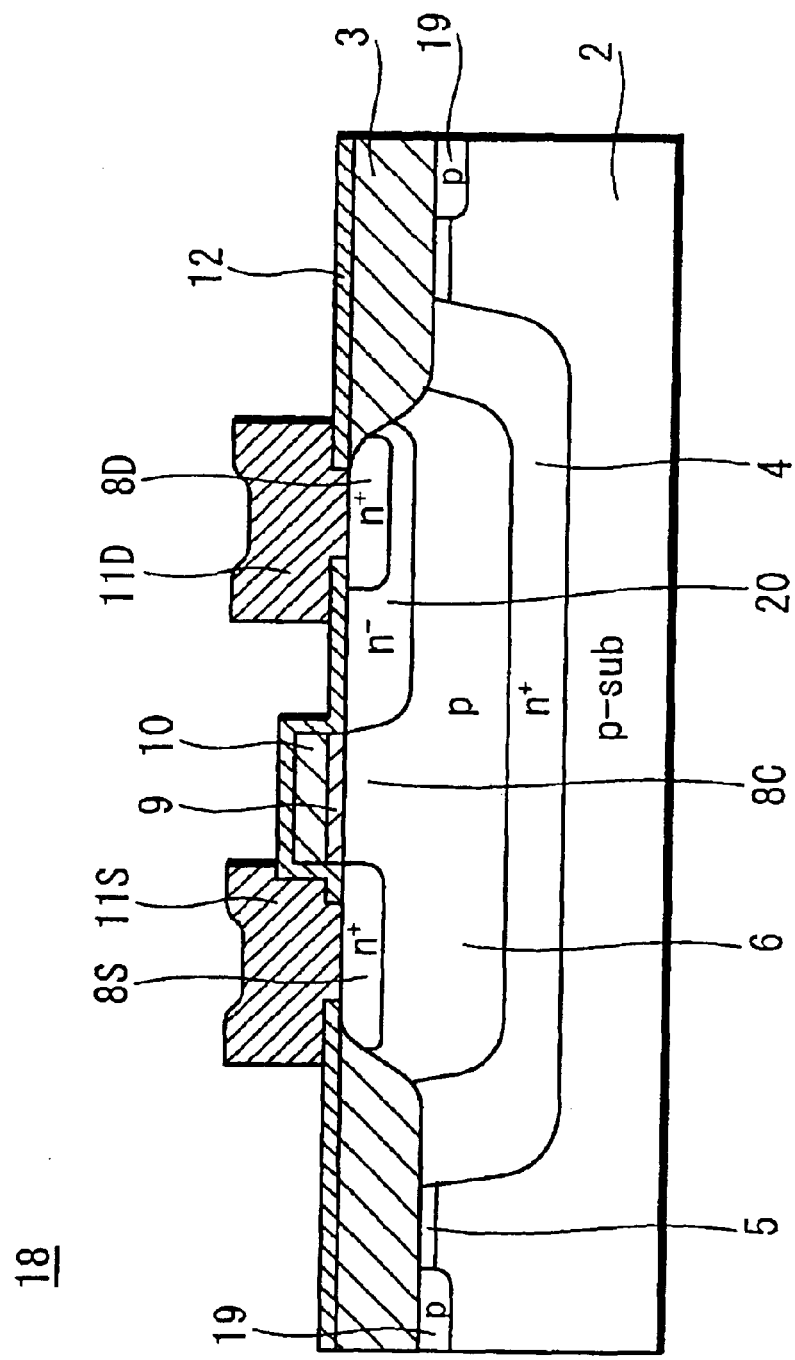
FIG. 8 is a diagram showing an arrangement of another example of a semiconductor device, in particular, its high withstand voltage MOS transistor according to the prior art.

Next, as shown in FIG. 6B, by using photolithography technique and anisotropy etching technique such as RIE, contact holes are formed on the insulating film 31 at its portions corresponding to source, drain and gate lead-out regions, and the drain electrode 32D interconnected to the drain region 28D, a p$^+$ well lead-out electrode (not shown) interconnected to the p-type semiconductor well region 26 and a gate lead-out electrode (not shown) interconnected to the gate electrode 30 are formed through these contact holes. The source electrode 32S, the drain electrode 32D, the well lead-out electrode and the gate lead-out electrode can be formed by vapor-depositing a metal film containing a barrier metal such as an Al film or a Ti/TiON/Ti/Al—Si lamination layer film in which Ti, TiON, Ti, Al—Si are laminated, in that order, from below and by patterning using photolithography technique and RIE technique.

In this manner, there can be obtained the target highly-efficient and high withstand voltage MOS transistor 21.

When the manufacturing method of the semiconductor device including the above-mentioned high withstand voltage MOS transistor is applied to the manufacturing process of a semiconductor device including a CMOS transistor, the above-described first-conductivity type semiconductor region 26 serves as a back-gate region of one second-conductivity type channel MOS transistor comprising the CMOS transistor and the above-described offset drain region 27 is formed at the same time the back-gate region of the other first-conductivity type channel MOS transistor comprising the CMOS transistor is formed. Specifically, when the high withstand voltage MOS transistor 21 is employed as one n-channel MOS transistor comprising the CMOS transistor, in the ion implantation process of the n-type impurities to form the offset drain region 27 shown in FIG. 4B, ions of the same n-type impurities 56 are implanted on the region in which the n-type semiconductor well region (not shown) serving as the back-gate region of the other p-channel MOS transistor should be formed. Next, in the heat treatment process shown in FIG. 5A, the p-type semiconductor well region (back-gate region) 26 of the n-channel MOS transistor 21, the offset drain region 27 formed of the n⁻ semiconductor region and the n-type semiconductor well region (back-gate region, not shown) of the p-channel MOS transistor are formed at the same time. The semiconductor device including the CMOS transistor is manufactured through the existing processes.

According to the high withstand voltage MOS transistor 21 including the offset drain structure according to this embodiment, since the lightly-doped offset drain region (n⁻ semiconductor region) 27 comprising the portion that does not overlap the p-type semiconductor well region 26 and the portion that overlaps part of the surface of the p-type semiconductor well region 26 is formed, the heavily-doped impurity region formed at portion of the surface of the p-type semiconductor well region 26 beneath the gate insulating film 29, accordingly, formed at portion of the channel region 28C is canceled by the portion in which the offset drain region overlaps the p-type semiconductor well region 26 and thereby removed. Thus, the whole of the channel region 28C formed of the p-type semiconductor well region between the source region 28S and the offset drain region 27 is formed with a uniform low concentration. Accordingly, the threshold voltage Vth can be prevented from becoming larger than a design value or can be prevented from being fluctuated so that a stable threshold voltage Vth can be obtained and that a stable low ON-state resistance can be obtained. That is, there can be realized the highly-efficient and high withstand voltage MOS transistor in which the high withstand voltage, the stable threshold voltage Vth and the low ON-state resistance are compatible.

When the MOS transistor 21 is applied to the CMOS transistor, the MOS transistor 21 having this offset drain structure is formed as one n-channel MOS transistor comprising the CMOS transistor and the offset drain region (n⁻ semiconductor region) 27 of this n-channel MOS transistor 21 is formed at the same time the n-type semiconductor well region that serves as the back-gate electrode of the other p-channel MOS transistor comprising the CMOS transistor is formed, whereby the high withstand voltage CMOS transistor can be obtained by the number of existing processes without increasing the processes.

Further, since the manufacturing method of the high withstand voltage according to this embodiment includes a series of the above-mentioned processes, in particular, the process for forming the lightly-doped offset drain region 27 that comprises the portion that does not overlap the p-type semiconductor well region serving as the back-gate region and the portion that overlaps part of the surface of the p-type semiconductor well region, the heavily-doped region formed at the above-described one portion of the surface of the channel region side of the p-type semiconductor well region 26 is canceled by the offset drain region 27 and hence the concentration in the channel region 28 formed of the p-type semiconductor well region 26 between the source region 28S and the offset drain region 27 can be made uniform in the whole area. Accordingly, the highly-efficient and high withstand voltage MOS transistor 21 in which the high withstand voltage, the threshold voltage Vth and the low ON-state resistance are compatible can be manufactured easily and stably.

When the manufacturing method of the above-described high withstand voltage MOS transistor is applied to the manufacturing process of the CMOS transistor, the above-described p-type semiconductor well region 21 serves as the back-gate electrode of one n-channel MOS transistor comprising the CMOS transistor and the above-described offset drain region 27 is formed at the same time the n-type semiconductor well region serving as the back-gate region of the other p-channel MOS transistor comprising the CMOS transistor is formed, whereby the semiconductor device including the CMOS transistor having at least one n-channel MOS transistor as the offset drain structure having the stable threshold voltage Vth and the low ON-state resistance can be manufactured by the number of the existing processes.

What is claimed is:

1. A semiconductor device including an MOS transistor in which a second conductivity type source region is formed on a first conductivity type semiconductor region, an offset drain region is electrically connected to a second conductivity type drain region and has an impurity concentration lower than that of said drain region, said offset drain region is composed of a portion that does not overlap said first conductivity type semiconductor region and a portion that overlaps part of the surface of said first conductivity type semiconductor region, said offset drain region is formed by a second conductivity type region at its portion that does not overlap said first conductivity type semiconductor region, said offset drain region is formed by a first conductivity type region having an impurity concentration lower than that of said first conductivity type semiconductor region at its portion that overlaps part of the surface of said first conductivity type semiconductor region and a gate electrode is formed on the surface extending from a channel region between said source region and said offset drain region to part of said offset drain region through a gate insulating film.

2. A semiconductor device according to claim 1, wherein said MOS transistor is formed as one of second conductivity type channel MOS transistors comprising a CMOS transistor, said first conductivity type semiconductor region serves as a back-gate region of said second conductivity type channel MOS transistor and said offset drain region is formed at the same time the back-gate region of the first conductivity type channel MOS transistor comprising said CMOS transistor is formed.

3. A semiconductor device according to claim 1, further comprising a first conductivity type element isolating layer formed beneath a isolation region for separating said MOS transistor at the same time said first conductivity type semiconductor region is formed.

4. A semiconductor device according to claim 3, wherein said isolation region is formed of a field insulating layer by selective oxidation and said first conductivity type semiconductor region and said first conductivity type element isolation layer are formed by implanting ions such that the semiconductor surface beneath said field insulating layer reaches a peak of an impurity concentration.

5. A semiconductor device according to claim 1, wherein said first conductivity type semiconductor region has on its surface formed a channel region the whole area of which is formed with a uniform concentration.

6. A semiconductor device manufacturing method comprising the steps of a process for forming a isolation region for separating an element forming region on a semiconductor substrate, a process for forming a first conductivity type semiconductor region on said element forming region, a process for forming an offset drain region composed of a portion that does not overlap said first conductivity type semiconductor region and a portion that overlaps part of the surface of said first conductivity type semiconductor region and which has an impurity concentration lower than that of a drain region, a process for forming second conductivity type source region and drain region on said first conductivity semiconductor region and said offset drain region, respectively, and a process for forming a gate electrode on the surface extending from a channel region composed of said first conductivity type semiconductor region between said source region and said offset drain region to said offset drain region through a gate insulating film.

7. A semiconductor device manufacturing method comprising the steps of a process for forming a field insulating layer by selective oxidation for isolating an element forming region after a second conductivity type buried region had been formed on a first conductivity type semiconductor substrate and a second conductivity type epitaxial layer had been formed, a process for forming a first conductivity type semiconductor region on said element forming region, a process for forming an offset drain region by implanting second conductivity type impurities over a portion that does not overlap said first conductivity type semiconductor region and a portion that overlaps part of the surface of said first conductivity type semiconductor region such that the portion that does not overlap said first conductivity type semiconductor region serves as a second conductivity type region having an impurity concentration lower than that of a drain region and the portion that overlaps part of the surface of said first conductivity type semiconductor region serves as a first conductivity type region having an impurity concentration lower than that of said first conductivity type semiconductor region, a process for forming second conductivity type source region and drain region on said first conductivity type semiconductor region and said offset drain region, respectively, and a process for forming a gate electrode on the surface extending from a channel region composed of said first conductivity type semiconductor region between said source region and said offset drain region to said offset drain region through a gate insulating film.

8. A semiconductor device manufacturing method according to claim 6, wherein said offset drain region is formed at its portion that does not overlap said first conductivity type semiconductor region as a second conductivity type region and said offset drain region is formed at its portion that overlaps part of the surface of said first conductivity type semiconductor region as a first conductivity region having an impurity concentration lower than that of said first conductivity type semiconductor region.

9. A semiconductor device manufacturing method according to claim 7, wherein said first conductivity type semiconductor region and said offset drain region are formed by implanting ions of second conductivity type impurities and heat treatment of activation after ions of first conductivity type impurities had been implanted.

10. A semiconductor device manufacturing method according to claim 9, wherein ions of second conductivity type impurities are implanted with a dose large enough to cancel an impurity concentration peak portion on the surface after ions of said first conductivity type impurities had been implanted.

11. A semiconductor device manufacturing method according to claim 7, wherein said first conductivity type semiconductor region and said offset drain region are formed by implanting ions of first conductivity type impurities the dose of which lies in a range of from $1 \times 10^{13}$ to $1 \times 10^{14}$ cm$^{-2}$ and by implanting ions of second conductivity type impurities the dose of which lies in a range of from $5 \times 10^{12}$ to $1 \times 10^{14}$ cm$^{-2}$ and said second conductivity type source region and drain region are formed by implanting ions of second conductivity type impurities the dose of which lies in a range of from $1 \times 10^{15}$ to $1 \times 10^{16}$ cm$^{-2}$.

12. A semiconductor device according to claim 6, wherein said first conductivity type semiconductor region and a first conductivity type element separation layer beneath said separation region are formed at the same time.

13. A semiconductor device according to claim 12, wherein said first conductivity type semiconductor region and the first conductivity type element separation layer beneath said isolation region are formed at the same time by introducing first conductivity type impurities such that the semiconductor surface beneath said isolation region reaches a peak of impurity concentration when ions are implanted.

14. A semiconductor device manufacturing method according to claim 7, wherein said first conductivity type semiconductor region, the first conductivity type element isolation layer beneath said isolation region and said offset drain region are formed at the same time by implanting ions of first conductivity type impurities through a positive type resist mask the opening end portion of which is tapered and by implanting ions of second conductivity type impurities through a positive type resist mask the opening end portion of which is tapered.

15. A semiconductor device manufacturing method according to claim 6, wherein said first conductivity type semiconductor region serves as a back-gate region of one second conductivity type channel MOS transistor comprising a CMOS transistor and said offset drain region is formed at the same time the back-gate region of the other first conductivity type channel MOS transistor comprising said CMOS transistor is formed.

16. A semiconductor device manufacturing method according to claim 7, wherein said first conductivity type semiconductor region serves as a back-gate region of one second conductivity type channel MOS transistor comprising a CMOS transistor and said offset drain region is formed at the same time a back-gate region of the other first conductivity type channel MOS transistor comprising said CMOS transistor is formed.

* * * * *